United States Patent
Luo et al.

(10) Patent No.: US 8,868,938 B2
(45) Date of Patent: Oct. 21, 2014

(54) POWER CIRCUIT FOR DATA STORAGE DEVICE TO PREVENT DATA LOSS

(75) Inventors: Qi-Yan Luo, Shenzhen (CN); Peng Chen, Shenzhen (CN); Song-Lin Tong, Shenzhen (CN)

(73) Assignees: Hong Fu Jin Precision (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 620 days.

(21) Appl. No.: 13/169,526

(22) Filed: Jun. 27, 2011

(65) Prior Publication Data

US 2012/0311352 A1    Dec. 6, 2012

(30) Foreign Application Priority Data

May 31, 2011    (CN) .......................... 2011 1 0143656

(51) Int. Cl.
*G06F 1/26* (2006.01)
*G06F 1/28* (2006.01)
*G11C 5/14* (2006.01)
*G06F 1/30* (2006.01)

(52) U.S. Cl.
CPC *G11C 5/145* (2013.01); *G06F 1/28* (2013.01); *G11C 5/147* (2013.01); *G06F 1/30* (2013.01)
USPC ............................ 713/300; 713/320; 713/340

(58) Field of Classification Search
CPC .............. G06F 1/26; G06F 1/263; G06F 1/30
USPC ...................... 713/300, 320, 340; 714/14, 22
See application file for complete search history.

(56) References Cited

U.S. PATENT DOCUMENTS

| | | | |
|---|---|---|---|
| 6,700,352 B1 * | 3/2004 | Elliott et al. | 320/130 |
| 7,269,755 B2 * | 9/2007 | Moshayedi et al. | 714/2 |
| 7,802,121 B1 * | 9/2010 | Zansky et al. | 713/340 |
| 8,065,562 B2 * | 11/2011 | Wilson et al. | 714/22 |
| 8,378,622 B2 * | 2/2013 | Yang et al. | 320/101 |
| 8,479,032 B2 * | 7/2013 | Trantham et al. | 713/340 |
| 8,627,117 B2 * | 1/2014 | Johnston | 713/300 |

* cited by examiner

*Primary Examiner* — Chun Cao
(74) *Attorney, Agent, or Firm* — Novak Druce Connolly Bove + Quigg LLP

(57) ABSTRACT

A power circuit which is applicable to a data storage device. A boost circuit receives a first voltage and converts it to a second voltage. A charging and discharging circuit receives the second voltage and charges a charging capacitor. As long as a voltage detecting circuit detects that the second voltage exists, it outputs a first selection signal. When the voltage detecting circuit detects that the second voltage does not exist, it outputs a second selection signal and also outputs a signal to the charging and discharging circuit, to release a stored voltage. A voltage selection circuit will output the second voltage according to the first selection signal, or will output the stored voltage from the charging capacitor according to the second selection signal. Buck circuits convert the second voltage or the stored voltage to the different voltages required by a control chip of the data storage device.

8 Claims, 4 Drawing Sheets

POWER CIRCUIT FOR DATA STORAGE DEVICE TO PREVENT DATA LOSS

BACKGROUND

1. Technical Field

The present disclosure relates to power circuits, and particularly to a power circuit for a data storage device.

2. Description of Related Art

At present, a solid state drive (SSD) is a data storage device that uses solid-state technology to store data with the intention of providing access in the same manner as a traditional block input or output hard disk drive (HDD). SSDs are distinguished from traditional HDDs, which are electromechanical devices containing spinning disks and movable read and write heads. SSDs, in contrast, use microchips which retain data in non-volatile memory chips and contain no moving parts. The SSD is characterized by factors such as high performance, low power consumption, small size, and other factors. However, if a sudden power failure occurs during writing of data to the SSD, the data will be lost. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by limitation. References to "an" or "one" embodiment in this disclosure are not necessarily to the same embodiment, and such references mean at least one.

Figure 1:
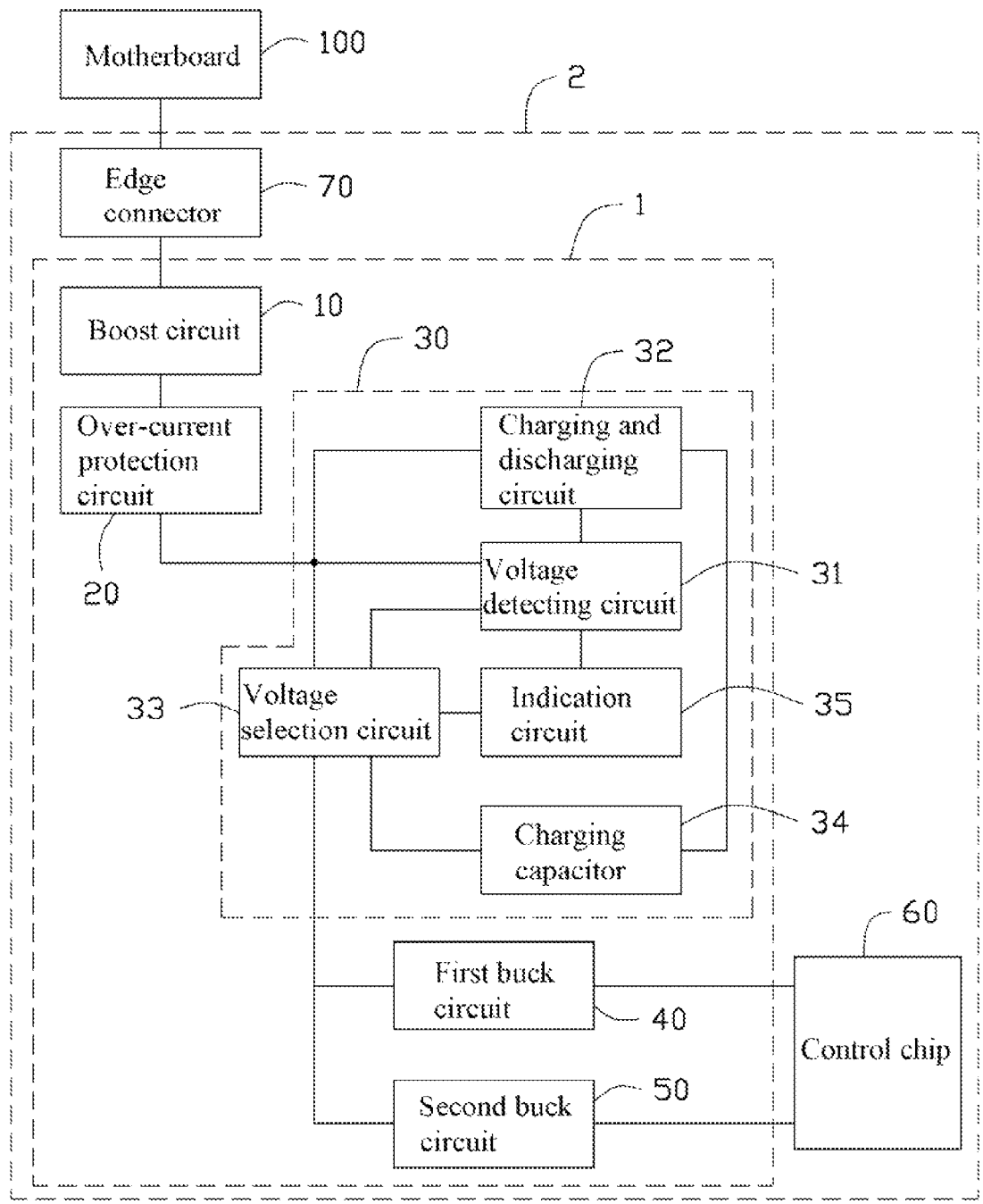
FIG. 1 is a block diagram of a power circuit for a data storage device in accordance with an exemplary embodiment of the present disclosure, the power circuit includes a control circuit.

Referring to FIG. 1, a power circuit 1 is arranged in a data storage device, such as a solid state drive (SSD) 2. The SSD 2 is electrically connected to a motherboard 100 through an edge connector 70 arranged on an edge of the SSD 2. The power circuit 1 in accordance with an exemplary embodiment includes a boost circuit 10, an over-current protection circuit 20, a control circuit 30, a first buck circuit 40, and a second buck circuit 50.

The control circuit 30 includes a voltage detecting circuit 31, a charging and discharging circuit 32, a voltage selection circuit 33, a charging capacitor 34, and an indication circuit 35. In one embodiment, the over-current protection circuit 20 is a fuse. The fuse operates when output current from the boost circuit 10 is greater than a preset current, to prevent the SSD 2 from being damaged. In one embodiment, the charging capacitor 34 is a supercapacitor.

The boost circuit 10 is configured to receive a first voltage, such as 1.5 volts (V), from the motherboard 100 and convert the first voltage to a second voltage, such as 5V. The boost circuit 10 outputs the second voltage to the voltage detecting circuit 31, to the charging and discharging circuit 32, and to the voltage selection circuit 33 through the over-current protection circuit 20. The charging and discharging circuit 32 charges the charging capacitor 34. The voltage detecting circuit 31 detects whether or not the over-current protection circuit 20 is outputting a voltage. When the motherboard 100 is powered on and the over-current protection circuit 20 is working normally, the voltage detecting circuit 31 detects the second voltage output from the over-current protection circuit 20. The voltage detecting circuit 31 outputs a first select signal to the voltage selection circuit 33 and outputs a first indication signal to the indication circuit 35, to indicate normal working for the motherboard 100 based on the over-current protection circuit 20 outputting the second voltage. The voltage selection circuit 33 outputs the second voltage to the first buck circuit 40 and the second buck circuit 50 according to the first selection signal. The first and second buck circuits 40 and 50 convert the second voltage to different voltages, such as 1.0V, 2.8V, 1.8V, and provide the converted voltage to a control chip 60 of the SSD 2. When the motherboard 100 is subjected to a power failure or when the over-current protection circuit 20 is disconnected, the voltage detecting circuit 31 detects the non-output of a voltage by the over-current protection circuit 20. The voltage detecting circuit 31 outputs a control signal to the charging and discharging circuit 32, to cause that circuit to discharge the charging capacitor 34 and provide the stored electrical energy (the discharging voltage) to the voltage selection circuit 33. At the same time, the voltage detecting circuit 31 outputs a second selection signal to the voltage selection circuit 33, and also outputs a second indication signal to the indication circuit 35 to indicate a loss of normal power to the motherboard 100. The voltage selection circuit 33 outputs the discharging voltage to the first and second buck circuits 40 and 50 according to the second selection signal. The first and second buck circuit 40 and 50 convert the discharging voltage to different voltages, such as 1.0V, 2.8V, 1.8V, and provide the converted voltages or one of them to the control chip 60.

Figure 2:
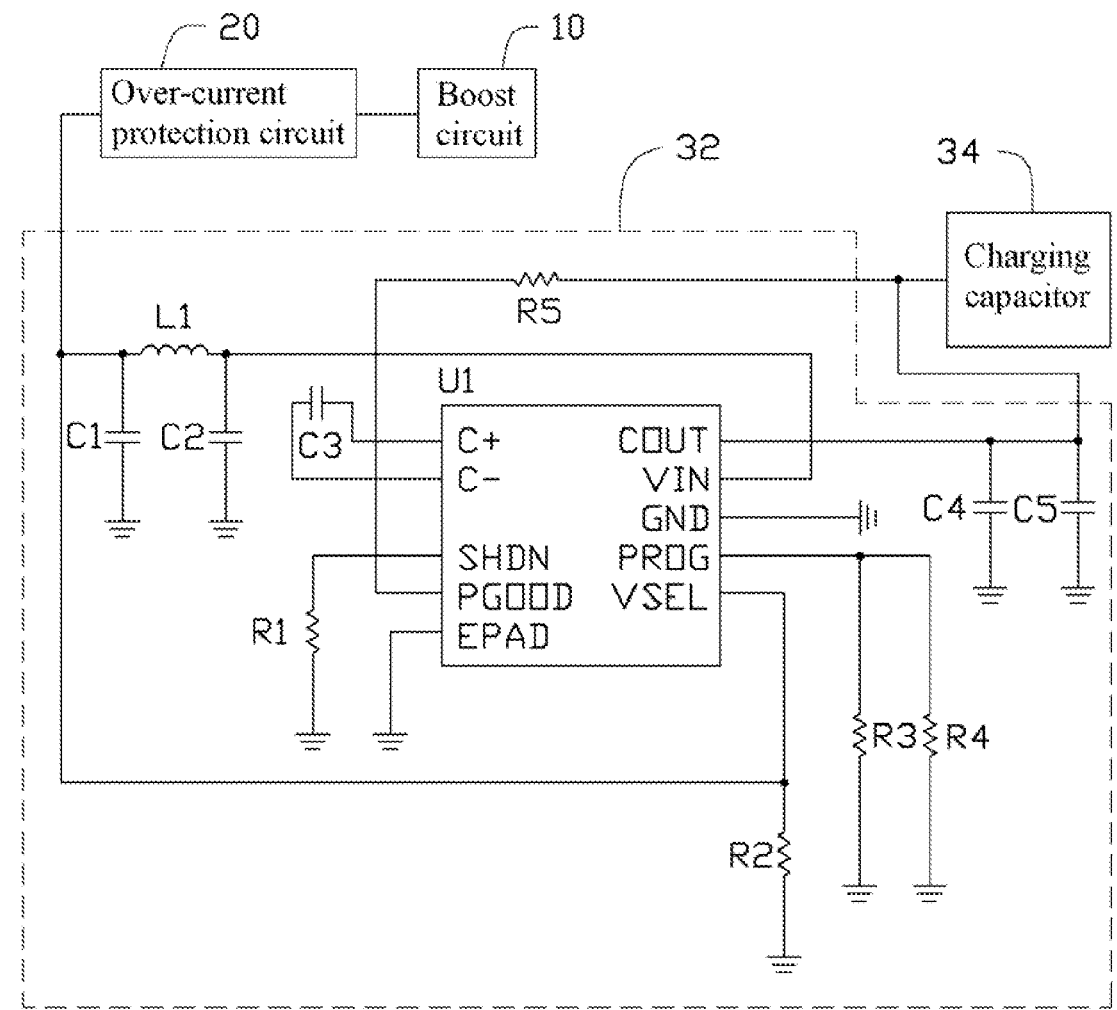
FIGS. 2 to 4 are circuit diagrams of the control circuit of FIG. 1.

Referring to FIG. 2, the charging and discharging circuit 32 includes a charging chip U1, an inductor L1, capacitors C1-C5, and resistors R1-R5. A first end of the inductor L1 is connected to the boost circuit 10 through the over-current protection circuit 20. An input pin VIN of the charging chip U1 is connected to a second end of the inductor L1. The capacitor C1 is connected between the first end of the inductor L1 and ground. The capacitor C2 is connected between the second end of the inductor L1 and ground. The capacitor C3 is connected between input and output (I/O) pins C+ and C− of the charging chip U1. The resistor R1 is connected between an I/O pin SHDN of the charging chip U1 and ground. An I/O pin VSEL of the charging chip U1 is connected to the boost circuit 10 through the over-current protection circuit 20 and also grounded through the resistor R2. The resistors R3 and R4 are connected in parallel between an I/O pin PROG of the charging chip U1 and ground. An I/O pin PGOOD of the charging chip U1 is connected to an I/O pin COUT of the charging chip U1 and the charging capacitor 34 through the resistor R5. The capacitors C4 and C5 are connected in parallel between the I/O pin COUT of the charging chip U1 and ground. In one embodiment, a type of the charging chip U1 may be LTC3225EDDB_TRMPBF.

Figure 3:
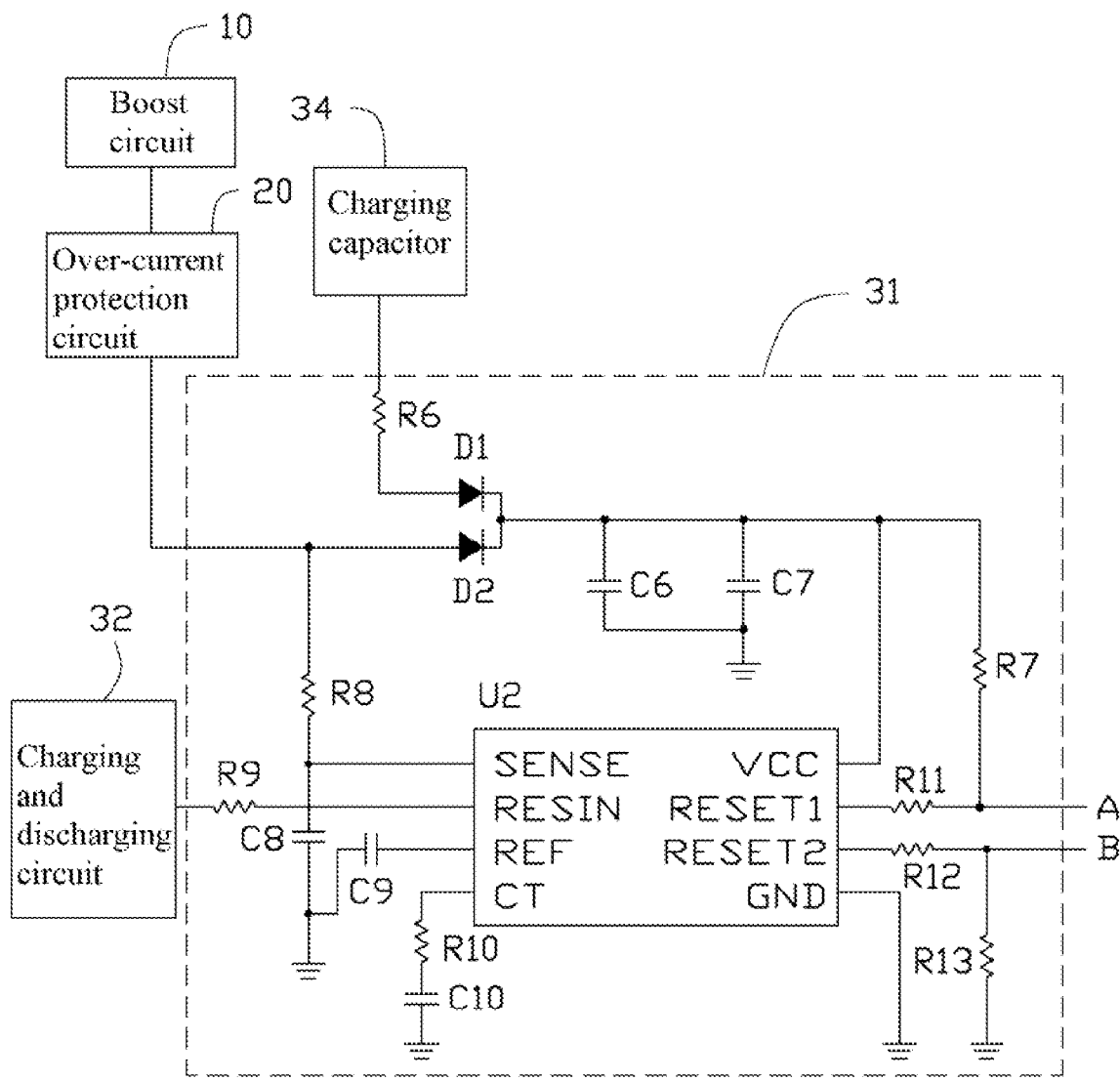

Referring to FIG. 3, the voltage detecting circuit 31 includes a voltage monitoring chip U2, diodes D1 and D2, resistors R6-R13, and capacitors C6-C10. A sensing pin SENSE of the voltage monitoring chip U2 is grounded through the capacitor C8 and also connected to a first end of the resistor R8. A second end of the resistor R8 is connected to an anode of the diode D2 and also connected to the boost circuit 10 through the over-current protection circuit 20. An I/O pin RESIN of the voltage monitoring chip U2 is connected to the charging and discharging circuit 32 through the resistor R9. An I/O pin REF of the voltage monitoring chip U2 is grounded through the capacitor C9. The resistor R10 and the capacitor C10 are connected in series and the other end of the resistor R10 is connected to an I/O pin CT of the voltage monitoring chip U2 to ground. An I/O pin RESET1 of the voltage monitoring chip U2 is connected to the voltage selection circuit 33 and the indication circuit 35 through the resistor R11. The I/O pin RESET1 of the voltage monitoring chip U2 is also connected to a voltage pin VCC of the voltage monitoring chip U2 and the cathodes of the diodes D1 and D2 through the resistor R11 and the resistor R7, connected in series. An I/O pin RESET2 of the voltage monitoring chip U2 is connected to a first end of the resistor R12. A second end of the resistor R12 is connected to the voltage selection circuit 33 and is also grounded through the resistor R13. An anode of the diode D1 is connected to the charging capacitor 34 through the resistor R6. The capacitors C6 and C7 are connected in parallel between the voltage pin VCC of the voltage monitoring chip U2 and ground. In one embodiment, a type of the voltage monitoring chip U2 may be TL7705BIDR.

Figure 4:
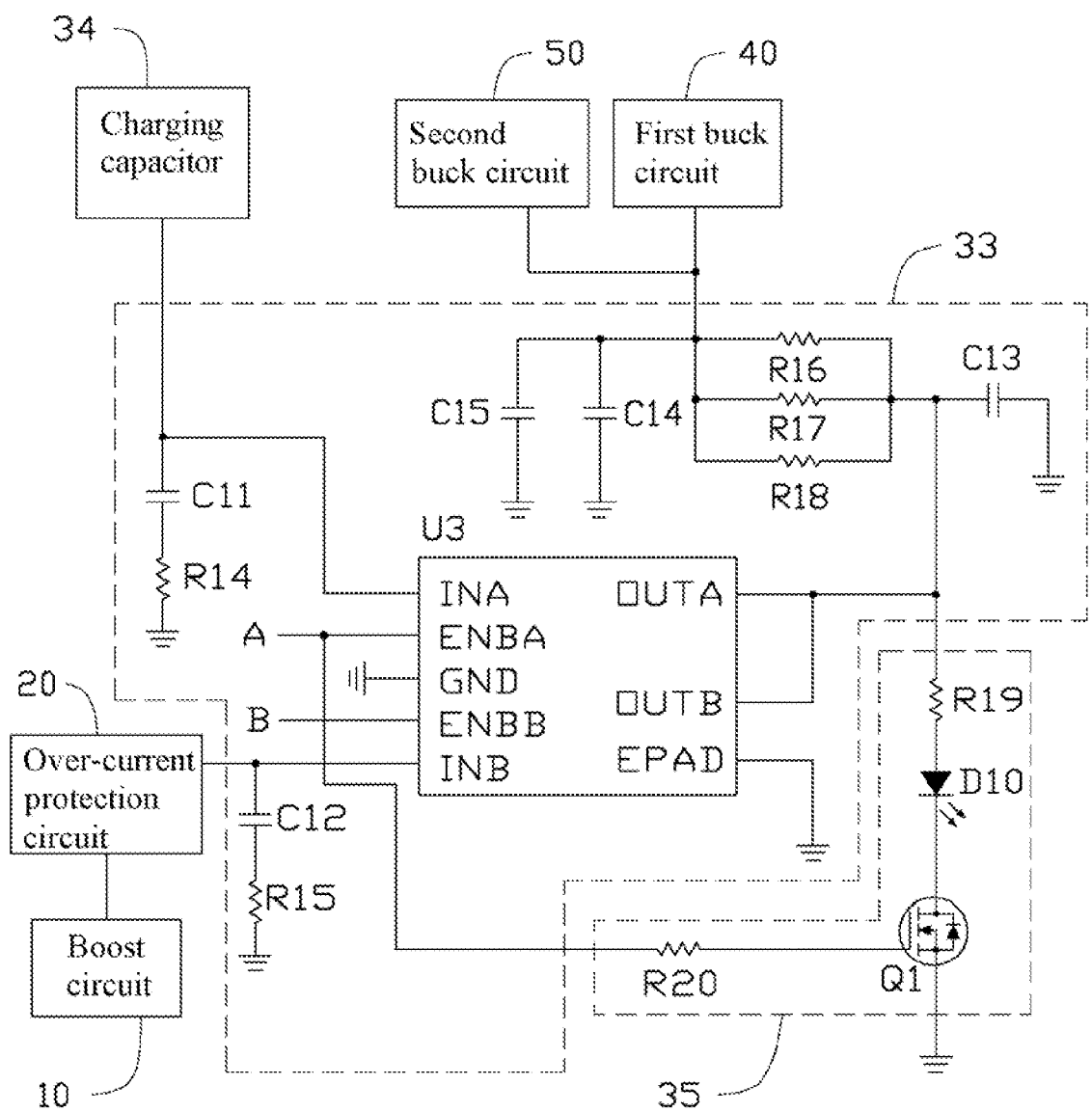

Referring to FIG. 4, the voltage selection circuit 33 includes a control chip U3, resistors R14-R18, and capacitors C11-C15. An input pin INA of the control chip U3 is connected to the charging capacitor 34 and also grounded through the capacitor C11 and the resistor R14 connected in series. I/O pins ENBA and ENBB of the control chip U3 are respectively connected to the I/O pins RESET1 and RESET2 of the voltage monitoring chip U2. An input pin INB of the control chip U3 is connected to the boost circuit 10 through the over-current protection circuit 20 and also grounded through the capacitor C12 and the resistor R15 which are connected in series. Output pins OUTA and OUTB of the control chip U3 are both connected to the indication circuit 35 and also connected to the first ends of the resistors R16, R17, and R18. The second ends of the resistors R16, R17, and R18 are connected to the first and second buck circuits 40 and 50. The capacitor C13 is connected between the output pin OUTA of the control chip U3 and ground. The capacitors C14 and C15 are connected in parallel between the second ends of the resistors R16, R17, and R18 and ground. In one embodiment, a type of the control chip U3 may be LTC4413EDD-1_TRPBF.

The indication circuit 35 includes a field effect transistor (FET) Q1, a light emitting diode (LED) D10, and resistors R19 and R20. A gate of the FET Q1 is connected to the I/O pin RESET1 of the voltage monitoring chip U2 through the resistor R20. A source of the FET Q1 is grounded. A drain of the FET Q1 is connected to a cathode of the LED D10. An anode of the LED D10 is connected to the output pin OUTA of the control chip U3, through the resistor R19.

In use, the SSD 2 is inserted into a memory slot of the motherboard 100 by means of the edge connector 70. The motherboard 100 is powered on and the over-current protection circuit 20 begins working normally, the boost circuit 10 receives 1.5V from the motherboard 100 and converts the 1.5V to 5V and provides the 5V to the charging chip U1, the voltage monitoring chip U2, and the control chip U3. The charging chip U1 charges the charging capacitor 34. The voltage monitoring chip U2 detects the presence of the 5V through the sensing pin SENSE, and outputs a low level signal through the I/O pin RESET1 to the I/O pin ENBA of the control chip U3 and the gate of the FET Q1 accordingly. The I/O pin RESET2 of the voltage monitoring chip U2 outputs a high level signal to the I/O pin ENBB of the control chip U3. The control chip U3 outputs the 5V received by the input pin INB to the first and second buck circuits 40 and 50 through the output pins OUTA and OUTB. The first and second buck circuits 40 and 50 convert the 5V to different voltages and provide the converted voltages to the control chip 60. The control chip 60 controls reading and writing of the SSD 2. At the same time, the FET Q1 is receiving a low level signal from the I/O pin RESET1 of the voltage monitoring chip U2 and is turned off. The LED D10 is unlit, indicating that the motherboard 100 is working normally.

When a power failure does take place, or the over-current protection circuit 20 is disconnected, the sensing pin SENSE of the voltage monitoring chip U2 stops experiencing the 5V, and therefore outputs a signal through the I/O pin RESIN to the charging and discharging circuit 32, to cause the charging capacitor 34 to discharge and release the discharging voltage (which may be 4.5V for example) to the voltage selection circuit 33. Simultaneously, the voltage monitoring chip U2 outputs a high level signal through the I/O pin RESET1 to the I/O pin ENBA of the control chip U3 and the gate of the FET Q1. The I/O pin RESET2 of the voltage monitoring chip U2 outputs a low level signal to the I/O pin ENBB of the control chip U3. The control chip U3 outputs the discharging voltage received from the input pin INA to the first and second buck circuits 40 and 50 through the output pins OUTA and OUTB. The first and second buck circuits 40 and 50 convert the discharging voltage they receive into different voltages and provide the converted voltages to the control chip 60. The control chip 60 controls the storage of data in the SSD 2. At the same time, the FET Q1 receives the high level signal from the I/O pin RESET1 of the voltage monitoring chip U2 and is turned on. The LED D10 lights up, to indicate that the motherboard 100 has lost normal power. The SSD 2 has sufficient time to complete the storage of data notwithstanding the loss of normal power to the motherboard 100.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A power circuit applicable to a data storage device, the power circuit comprising:
  a boost circuit to receive a first voltage from a motherboard and convert the first voltage to a second voltage;
  a control circuit comprising:
    a charging capacitor;
    a charging and discharging circuit to receive the second voltage and charge the charging capacitor, wherein the charging and discharging circuit comprises a charging chip, an inductor, first to fifth capacitors, and first to fifth resistors, an input pin of the charging chip is connected to a first end of the inductor, a second end of the inductor is connected to the boost circuit, the first capacitor is connected between the first end of the inductor and ground, the second capacitor is connected between the second end of the inductor and ground, the third capacitor is connected between first and second I/O pins of the charging chip, the first resistor is connected between a third I/O pin of the charging chip and ground, a fourth I/O pin of the charging chip is connected to the boost circuit and also grounded through the second resistor, the third and the fourth resistors are connected in parallel between a fifth I/O pin of the charging chip and ground, a sixth I/O pin of the charging chip is connected to a seventh I/O pin of the charging chip through the fifth resistor, and also connected to the charging capacitor, and the fourth and the fifth capacitors are connected in parallel between the seventh I/O pin and ground;

a voltage detecting circuit to detect whether the second voltage exists or not, wherein the voltage detecting circuit outputs a first selection signal in response to the voltage detecting circuit detects that the second voltage exists, the voltage detecting circuit outputs a second selection signal, and also outputs a control signal to the charging and discharging circuit to control the charging capacitor to discharge in response to the voltage detecting circuit detects that the second voltage does not exist; and a voltage selection circuit to receive the first selection signal and output the second voltage according to the first selection signal, or receive the second selection signal and output a discharging voltage of the charging capacitor according to the second selection signal; and first and second buck circuits to receive the second voltage or the discharging voltage of the charging capacitor, and convert the second voltage or the discharging voltage to different voltages and provide the different voltages to a control chip of the data storage device.

2. The power circuit of claim 1, further comprising an over-current protection circuit, wherein the over-current protection circuit is connected to the boost circuit, the charging and discharging circuit, the voltage detecting circuit, and the voltage selection circuit, the over-current protection circuit is disconnected when current output from the boost circuit is greater than a preset current.

3. The power circuit of claim 2, wherein the over-current protection circuit is a fuse.

4. The power circuit of claim 1, wherein the control circuit further comprises an indication circuit, the indication circuit is connected to the voltage selection circuit to receive the second voltage or the discharging voltage, and also connected to the voltage detecting circuit, when the voltage detecting circuit detects the second voltage exists, the indication circuit receives a first indication signal from the voltage detecting circuit, to indicate the motherboard works normally, when the voltage detecting circuit detect the second voltage does not exist, the indication circuit receives a second indication signal from the voltage detecting circuit, to indicate the motherboard loses power.

5. The power circuit of claim 4, wherein the voltage detecting circuit comprises a voltage monitoring chip, first and second diodes, sixth to thirteen resistors, and sixth to tenth capacitors, a sensing pin of the voltage monitoring chip is grounded through the eighth capacitor, and also connected to the boost circuit through the eighth resistor and connected to an anode of the second diode, a first I/O pin of the voltage monitoring chip is connected to the charging and discharging circuit through the ninth resistor, a second I/O pin of the voltage monitoring chip is grounded through the ninth capacitor, a third I/O in of the voltage monitoring chip is grounded through the tenth resistor and the tenth capacitor connected in series, a fourth I/O pin of the voltage monitoring chip is connected to the voltage selection circuit and the indication circuit through the eleventh resistor, the fourth I/O pin of the voltage monitoring chip is also connected to a voltage pin of the voltage monitoring chip through the seventh resistor and also connected to cathodes of the first and the second diodes, a fifth I/O pin of the voltage monitoring chip is connected to the voltage selection circuit through the twelfth resistor and also grounded through the thirteen resistor, an anode of the first diode is connected to the charging capacitor through the sixth resistor, the sixth and the seventh capacitors are connected in parallel between the voltage pin of the voltage monitoring chip and ground.

6. The power circuit of claim 5, wherein the voltage selection circuit comprises a control chip, fourteenth to eighteenth resistors, and eleventh to fifteenth capacitors, a first input pin of the control chip is connected to the charging capacitor and also grounded through the eleventh capacitor and the fourteenth resistor connected in series, first and second I/O pins of the control chip are respectively connected to the fourth and the fifth I/O pins of the voltage monitoring chip, a second input pin of the control chip is connected to the boost circuit and also grounded through the twelfth capacitor and the fifteenth resistor connected in series, first and second output pins of the control chip are both connected to the indication circuit and first ends of the sixteenth, seventeenth, and eighteenth resistors, second ends of the sixteenth, seventeenth, and eighteenth resistors are connected to the first and the second buck circuits, the thirteenth capacitor is connected between the first output pin of the control chip and ground, the fourteenth and the fifteenth capacitors are connected in parallel between the second end of the sixteenth resistor and ground.

7. The power circuit of claim 6, wherein the indication circuit comprises a field effect transistor (FET), a light emitting diode (LED), and nineteenth and twentieth resistors, a gate of the FET is connected to the fourth I/O pin of the voltage monitoring chip through the twentieth resistor, a source of the FET is grounded, a drain of the FET is connected to a cathode of the LED, an anode of the LED is connected to the first output pin of the control chip through the nineteenth resistor.

8. The power circuit of claim 1, wherein the charging capacitor is a supercapacitor.

* * * * *